(12) United States Patent  (10) Patent No.: US 12,389,592 B2
Chang  (45) Date of Patent: Aug. 12, 2025

(54) MEMORY DEVICE AND METHOD OF FORMING THE SAME

(71) Applicant: NANYA TECHNOLOGY CORPORATION, New Taipei (TW)

(72) Inventor: Chin-Piao Chang, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 617 days.

(21) Appl. No.: 17/810,611

(22) Filed: Jul. 4, 2022

(65) Prior Publication Data

US 2024/0008269 A1  Jan. 4, 2024

(51) Int. Cl.
| | |
|---|---|
| *H10B 20/20* | (2023.01) |
| *G11C 17/16* | (2006.01) |
| *H01L 21/283* | (2006.01) |
| *H01L 21/311* | (2006.01) |
| *H01L 21/768* | (2006.01) |
| *H01L 23/525* | (2006.01) |

(52) U.S. Cl.
CPC ........... *H10B 20/20* (2023.02); *G11C 17/16* (2013.01); *H01L 21/283* (2013.01); *H01L 21/76877* (2013.01); *H01L 23/5252* (2013.01); *H01L 21/31105* (2013.01); *H01L 2221/101* (2013.01); *H01L 2221/1068* (2013.01)

(58) Field of Classification Search
CPC ........... H01L 23/5252; H01L 23/5254; H01L 2221/101–1015; H01L 21/31105–31122; H01L 21/311–31144; H01L 21/282–2885; H01L 21/44–449; H01L 21/76877–76883; H01L 21/47635; H01L 21/461; H01L 21/4763; H01L 21/76–765; H10D 84/0151; H10D 84/0188; H10D 30/795
See application file for complete search history.

(56) References Cited

U.S. PATENT DOCUMENTS

| | | | |
|---|---|---|---|
| 2008/0073755 A1* | 3/2008 | Ang | H01L 23/5252 257/656 |
| 2014/0024210 A1* | 1/2014 | Yang | H01L 21/7684 257/E21.586 |
| 2020/0212049 A1* | 7/2020 | Lin | H10B 12/34 |
| 2020/0343182 A1* | 10/2020 | Lin | H10B 20/25 |
| 2020/0343253 A1* | 10/2020 | Lin | H10B 12/31 |
| 2023/0024465 A1* | 1/2023 | Li | H10B 12/36 |

* cited by examiner

Primary Examiner — Zandra V Smith
Assistant Examiner — Douglas Yap
(74) Attorney, Agent, or Firm — CKC & Partners Co., LLC

(57) ABSTRACT

A memory device includes a semiconductor substrate, an isolation structure, and an anti-fuse structure. The isolation structure is disposed in the semiconductor substrate. The anti-fuse structure is disposed in the isolation structure and includes a first electrode and a second electrode. The second electrode is disposed adjacent to the first electrode. Both of a top surface of the first electrode and a top surface of the second electrode are below a top surface of the semiconductor substrate.

19 Claims, 6 Drawing Sheets

MEMORY DEVICE AND METHOD OF FORMING THE SAME

BACKGROUND

Technical Field

The present disclosure relates to a memory device and a method of forming a memory device.

Description of Related Art

Semiconductor memory devices may be classified into two categories, volatile memory devices and nonvolatile memory devices. In contrast to the volatile memory devices, the information of the nonvolatile memory devices is preserved even with the power removed. In regards to the nonvolatile memory devices, some designs allow multiple programming, while other designs allow one-time programming. Typically, the manufacturing techniques used to form nonvolatile memory devices are quite different from a standard logic process, which dramatically increases the complexity and chip size.

SUMMARY

One aspect of the present disclosure is a memory device.

According to some embodiments of the present disclosure, a memory device includes a semiconductor substrate, an isolation structure, and an anti-fuse structure. The isolation structure is disposed in the semiconductor substrate. The anti-fuse structure is disposed in the isolation structure and includes a first electrode and a second electrode. The second electrode is disposed adjacent to the first electrode. Both of a top surface of the first electrode and a top surface of the second electrode are below a top surface of the semiconductor substrate.

In some embodiments, the memory device further includes a dielectric layer above the semiconductor substrate and the isolation structure.

In some embodiments, the first contact includes a bottom portion in the isolation structure and a top portion in the dielectric layer.

In some embodiments, the first contact is configured to apply a first voltage to the first electrode and the second contact is configured to apply a second voltage different from the first voltage to the second electrode to convert a portion of the isolation structure between the first electrode and the second electrode into a permanent electrically conductive path.

In some embodiments, both of the top surface of the first electrode and the top surface of the second electrode are below a top surface of the isolation structure.

In some embodiments, the top surface of the first electrode is substantially coplanar with the top surface of the second electrode.

In some embodiments, a bottom surface of the first electrode is substantially coplanar with a bottom surface of the second electrode.

In some embodiments, the memory device further includes a first contact and a second contact. The first contact is disposed on the first electrode. The second contact is disposed on the second electrode.

In some embodiments, both of a bottom surface of the first contact and a bottom surface of the second contact are below the top surface of the semiconductor substrate.

In some embodiments, the first electrode extends along a first direction, and the first electrode and the second electrode are arranged parallel with each other along a second direction perpendicular to the first direction in a top view.

In some embodiments, the first electrode has a strip profile in a top view.

In some embodiments, the first electrode and the second electrode include the same materials.

Another aspect of the present disclosure is a method of forming memory device.

According to some embodiments of the present disclosure, a method of forming memory device includes forming an isolation structure in a semiconductor substrate. The isolation structure is etched to form a first opening and a second opening. A first electrode and a second electrode of an anti-fuse structure are formed respectively in the first opening and the second opening such that both of a top surface of the first electrode and a top surface of the second electrode are below a top surface of the isolation structure. A dielectric layer is formed above the isolation structure. A first voltage is applied to the first electrode and a second voltage different from the first voltage is applied to the second electrode to convert a portion of the isolation structure between the first electrode and the second electrode into a permanent electrically conductive path.

In some embodiments, the method further includes forming a first contact and a second contact in the dielectric layer such that the first voltage is applied to the first electrode through the first contact and the second voltage is applied to the second electrode through the second contact.

In some embodiments, forming the first contact and the second contact is performed such that a portion of the first contact and a portion of the second contact are formed within the isolation structure.

In some embodiments, forming the first contact and the second contact is performed such that the top surface of the first electrode and the top surface of the second electrode are respectively in contact with the first contact and the second contact.

In some embodiments, forming the first electrode and the second electrode is performed further such that the top surface of the first electrode and the top surface the second electrode are below a top surface of the semiconductor substrate.

In some embodiments, forming the first electrode and the second electrode is performed such that the first electrode and the second electrode are in contact with the isolation structure.

In some embodiments, forming the first electrode and the second electrode is performed such that a bottom surface of the first electrode is coplanar with a bottom surface of the second electrode.

In some embodiments, forming the isolation structure in the semiconductor substrate includes forming a trench in the semiconductor substrate and filling an anti-fuse dielectric material in the trench to form the isolation structure.

In the aforementioned embodiments, since both of the top surface of the first electrode and the top surface of the second electrode are below the top surface of the semiconductor substrate, a size of the memory device can be decreased. Further, a manufacturing process of the memory device can be simplified.

It is to be understood that both the foregoing general description and the following detailed description are by examples, and are intended to provide further explanation of the disclosure as claimed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
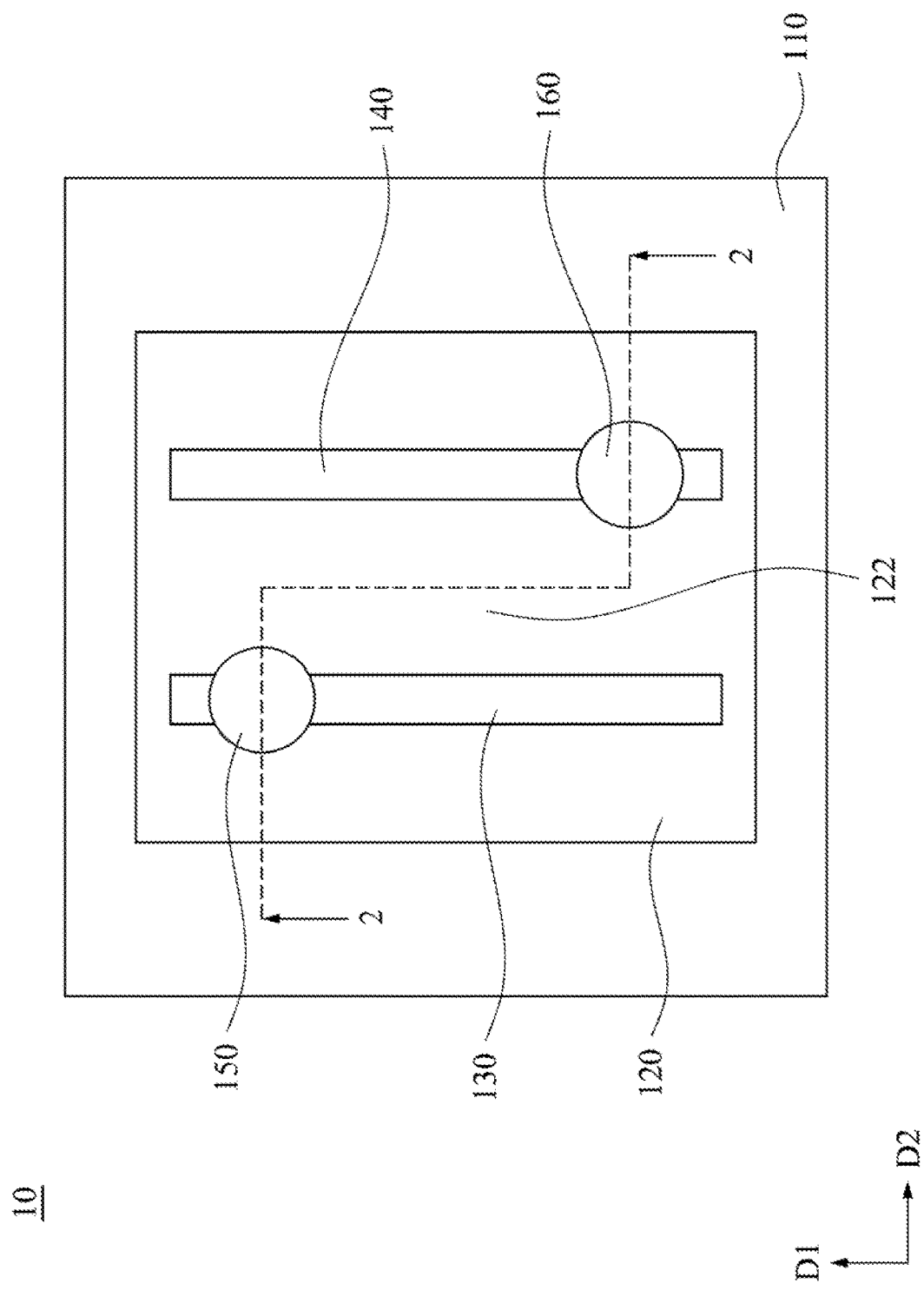
FIG. 1 is a top view of a layout of a memory device in accordance with some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
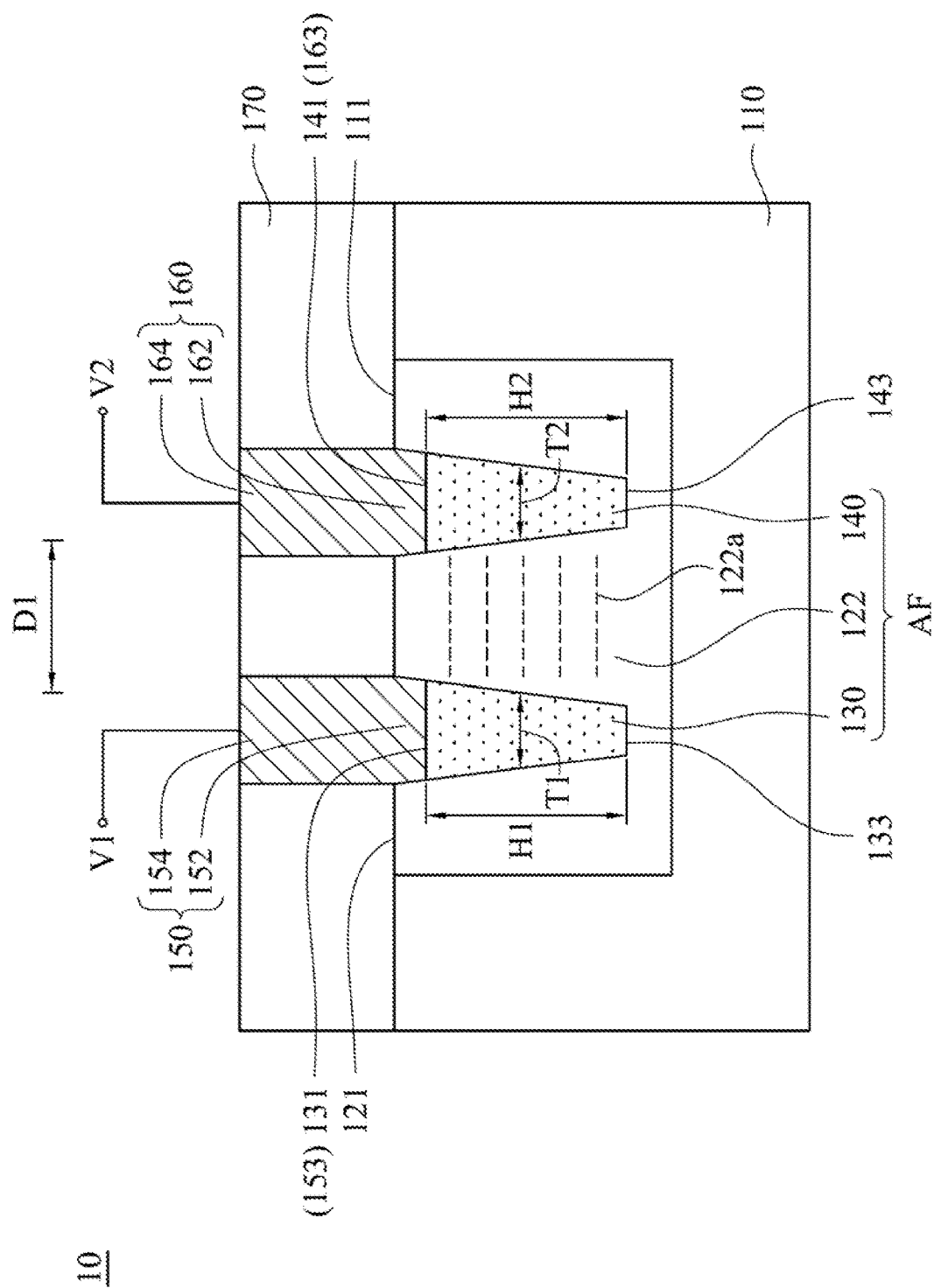
FIG. 2 is a cross-sectional view of the memory device taken along line A-A of FIG. 1.

FIG. 1 is a top view of a layout of a memory device 10 in accordance with some embodiments of the present disclosure, and FIG. 2 is a cross-sectional view of the memory device 10 taken along line 2-2 of FIG. 1. Referring to FIG. 1 and FIG. 2, a memory device 10 includes a semiconductor substrate 110, an isolation structure 120, and an anti-fuse structure AF. The isolation structure 120 is disposed in the semiconductor substrate 110. The anti-fuse structure AF is disposed in the isolation structure 120. The anti-fuse structure AF includes a first electrode 130 and a second electrode 140. The second electrode 140 of the anti-fuse structure AF is disposed adjacent to and spaced apart from the first electrode 130 of the anti-fuse structure AF. Both of a top surface 131 of the first electrode 130 of the anti-fuse structure AF and a top surface 141 of the second electrode 140 of the anti-fuse structure AF are below a top surface 111 of the semiconductor substrate 110. Since an entirety of the anti-fuse structure AF is disposed within the isolation structure 120 (or the semiconductor substrate 110), a size of the memory device 10 can be decreased. Further, a manufacturing process of the memory device 10 can be simplified.

The memory device 10 further includes a first contact 150 and a second contact 160 adjacent to the first contact 150. The first contact 150 is disposed on the first electrode 130 of the anti-fuse structure AF, and the second contact 160 is disposed on the second electrode 140 of the anti-fuse structure AF. In greater details, the first contact 150 is in contact with and electrically connected to the first electrode 130 and the second contact 160 is in contact with and electrically connected to the second electrode 140.

Programming mechanism by using the anti-fuse structure AF to store digital information is to apply the first voltage V1 to the first electrode 130 through the first contact 150 and apply the second voltage V2 to the second electrode 140 through the second contact 160 to convert a portion 122 of the isolation structure 120 between the first electrode 130 and the second electrode 140 into a permanent electrically conductive path 122a so as to conduct between the first electrode 130 and the second electrode 140 of the anti-fuse structure AF, such that the anti-fuse structure AF is in an "On" state. Conversely, the unprogrammed anti-fuse structure AF is in an "Off" state. It is noted that a voltage difference (also referred as voltage bias) between the first voltage V1 and the second voltage V2 may exceed a certain level (e.g., exceed a predetermined voltage bias) to program the anti-fuse structure AF. In some embodiments, the voltage V1 connected to the first electrode 130 through the first contact 150 is higher than the voltage V2 connected to the second electrode 140 through the second contact 160. For example, the voltage V1 is a high voltage and the voltage V2 is a low voltage or at zero (ground) voltage. It is noted that the anti-fuse structure AF further includes a portion 122 of the isolation structure 120 between the first electrode 130 and the second electrode 140, and the portion 122 of the isolation structure 120 is referred as an anti-fuse dielectric material of the anti-fuse structure AF. The anti-fuse structure AF is programmed by applying a voltage bias across the first electrode 130 and the second electrode 140 to rupture the portion 122 of the isolation structure 120 (i.e., anti-fuse dielectric material) and form the permanent electrically conductive path 122a between the first electrode 130 and the second electrode 140. That is, the portion 122 of the isolation structure 120 is changed from non-conductive (i.e., dielectric material) to conductive (i.e., conductor) when programming the anti-fuse structure AF.

In some embodiments, both of the top surface 131 of the first electrode 130 of the anti-fuse structure AF and the top surface 141 of the second electrode 140 of the anti-fuse structure AF are below a top surface 121 of the isolation structure 120. In other words, an entirety of the anti-fuse structure AF (including the first electrode 130, the second electrode 140 and the portion 122 of the isolation structure 120 between the first electrode 130 and the second electrode 140) is within the isolation structure 120 (or the semiconductor substrate 110).

In some embodiments, a height H1 of the first electrode 130 of the anti-fuse structure AF is substantially the same as a height H2 of the second electrode 140 of the anti-fuse structure AF. In greater details, the top surface 131 of the first electrode 130 of the anti-fuse structure AF is substantially coplanar with the top surface 141 of the second electrode 140 of the anti-fuse structure AF, and a bottom surface 133 of the first electrode 130 of the anti-fuse structure AF is substantially coplanar with a bottom surface 143 of the second electrode 140 of the anti-fuse structure AF. In some embodiments, the height H1 of the first electrode 130 of the anti-fuse structure AF is in a range of about 130 nanometers (nm) to about 150 nanometers (e.g., 140 nanometers), and the height H2 of the second electrode 140 of the anti-fuse structure AF is in a range of about 130 nanometers to about 150 nanometers (e.g., 140 nanometers). As such, the first electrode 130 and the second electrode 140 of the anti-fuse structure AF can have better uniformity.

In some embodiments, a thickness T1 of the first electrode 130 of the anti-fuse structure AF is substantially the same as a thickness T2 of the second electrode 140 of the anti-fuse structure AF. The thickness T1 of the first electrode 130 of the anti-fuse structure AF is in a range of about 70 nanometers to about 90 nanometers (e.g., 80 nanometers), and the thickness T2 of the second electrode 140 of the anti-fuse structure AF is in a range of about 70 nanometers to about 90 nanometers (e.g., 80 nanometers). As such, the permanent electrically conductive path 122a between the first electrode 130 and the second electrode 140 of the anti-fuse structure AF can be easily formed during programming.

In some embodiments, a distance D1 between the first electrode 130 of the anti-fuse structure AF and the second electrode 140 of the anti-fuse structure AF (i.e., a length of the portion 122 of the isolation structure 120 from the first electrode 130 to the second electrode 140) is in a range of about 20 nanometers to about 35 nanometers (e.g., 27 nanometers). As such, the permanent electrically conductive path 122a can be formed between the first electrode 130 and the second electrode 140. Further, the size of the anti-fuse structure AF can be decreased. If the distance D1 between the first electrode 130 and the second electrode 140 is less than about 20 nanometers, an interference would occur, thereby adversely affecting performance of the memory device 10; if the distance D1 between the first electrode 130 and the second electrode 140 is greater than about 35 nanometers, the size of the anti-fuse structure AF (or memory device 10) would be too large. In some embodiments, a size of the anti-fuse structure AF is about 240-250 nanometers (e.g., 248 nanometers) multiple about 240-250 nanometers (e.g., 248 nanometers). With such configuration of the anti-fuse structure AF discussed above, the size of the anti-fuse structure AF can be decreased. For example, the size of the anti-fuse structure AF can be decreased about 12%.

In some embodiments, the first electrode 130 of the anti-fuse structure AF and the second electrode 140 of the anti-fuse structure AF have the same profiles, such as tapered profiles. For example, the first electrode 130 of the anti-fuse structure AF includes a first bottom portion and a first top portion wider than the first bottom portion, and the second electrode 140 of the anti-fuse structure AF includes a second bottom portion and a second top portion wider than the second bottom portion.

The memory device 10 further includes a dielectric layer 170 above the semiconductor substrate 110 and the isolation structure 120. The dielectric layer 170 surrounds the first contact 150 and the second contact 160, and the isolation structure 120 surrounds the first electrode 130 of the anti-fuse structure AF and the second electrode 140 of the anti-fuse structure AF. In some embodiments, the first contact 150 includes a bottom portion 152 in the isolation structure 120 and a top portion 154 in the dielectric layer 170. The second contact 160 includes a bottom portion 162 in the isolation structure 120 and a top portion 164 in the dielectric layer 170. In some embodiments, both of a bottom surface 153 of the first contact 150 and a bottom surface 163 of the second contact 160 are below the top surface 111 of the semiconductor substrate 110. The bottom surface 153 of the first contact 150 is spaced apart from the dielectric layer 170 and the bottom surface 163 of the second contact 160 is spaced apart from the dielectric layer 170 as well.

In some embodiments, the bottom portion 152 of the first contact 150 and the top portion 154 of the first contact 150 have different profiles. For example, the bottom portion 152 of the first contact 150 has a tapered profile and the top portion 154 of the first contact 150 has a rectangle profile. The bottom portion 152 of the first contact 150 has a minimum width smaller than that of the top portion 154 of the first contact 150. Similarly, the bottom portion 162 of the second contact 160 and the top portion 164 of the second contact 160 have different profiles. For example, the bottom portion 162 of the second contact 160 has a tapered profile and the top portion 164 of the second contact 160 has a rectangle profile. The bottom portion 162 of the second contact 160 has a minimum width smaller than that of the top portion 164 of the second contact 160.

In some embodiments, as shown in FIG. 1 (top view), the first electrode 130 of the anti-fuse structure AF extends along a first direction D1, and the second electrode 140 of the anti-fuse structure AF extends along the first direction D1. The first electrode 130 of the anti-fuse structure AF and the second electrode 140 of the anti-fuse structure AF are arranged parallel with each other along a second direction D2 perpendicular to the first direction D1. In some embodiments, the first electrode 130 of the anti-fuse structure AF and the second electrode 140 of the anti-fuse structure AF have the same profiles in the top view. For example, the first electrode 130 of the anti-fuse structure AF and the second electrode 140 of the anti-fuse structure AF have strip profiles.

In some embodiments, as shown in FIG. 1, the first contact 150 is disposed above an end of the first electrode 130 and the second contact 160 is disposed above an end of the second electrode 140, wherein the end of the first electrode 130 is misaligned with the end of the second electrode 140. As such, the first contact 150 and the second contact 160 are misaligned with each other. If the first contact 150 is aligned with the second contact 160 (e.g., the first contact 150 and the second contact 160 are arranged in the second direction D2), the first contact 150 would be too close to the second contact 160, thereby causing interference thereof.

In some embodiments, the first electrode 130 of the anti-fuse structure AF and the second electrode 140 of the anti-fuse structure AF include the same materials. For example, the first electrode 130 of the anti-fuse structure AF and the second electrode 140 of the anti-fuse structure AF include metal (e.g., titanium), metal nitride (e.g., titanium nitride), or other suitable conductive materials. The first contact 150 and the second contact 160 may include the same material, such as tungsten, or other suitable metal materials.

FIG. 3 to FIG. 6 are cross-sectional views of a method of forming the memory device at various stages in accordance with some embodiments of the present disclosure.

Figure 3:
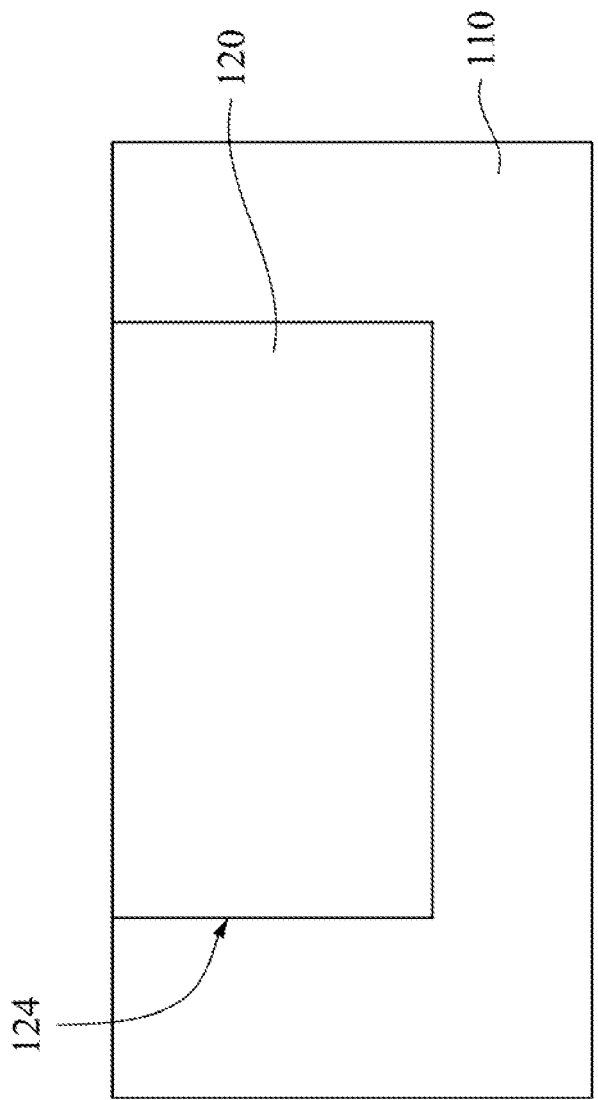
FIG. 3 to FIG. 6 are cross-sectional views of a method of forming the memory device at various stages in accordance with some embodiments of the present disclosure.

Referring to FIG. 3, the semiconductor substrate 110 is provided. In some embodiments, the semiconductor substrate 110 includes silicon. In some other embodiments, the semiconductor substrate 110 includes another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The isolation structure 120 is formed in the semiconductor substrate 110. In some embodiments, the isolation structure 120 is shallow trench isolation (STI). The formation of the isolation structure 120 may include etching the semiconductor substrate 110 to form a trench 124 in the semiconductor substrate 110 and then filling an anti-fuse dielectric material in the trench 124. The anti-fuse dielectric material may include insulator materials such as silicon dioxide. In some embodiments, the isolation structure 120 is formed by physical vapor deposition (PVD), chemical vapor deposition (CVD), or the like.

Figure 4:
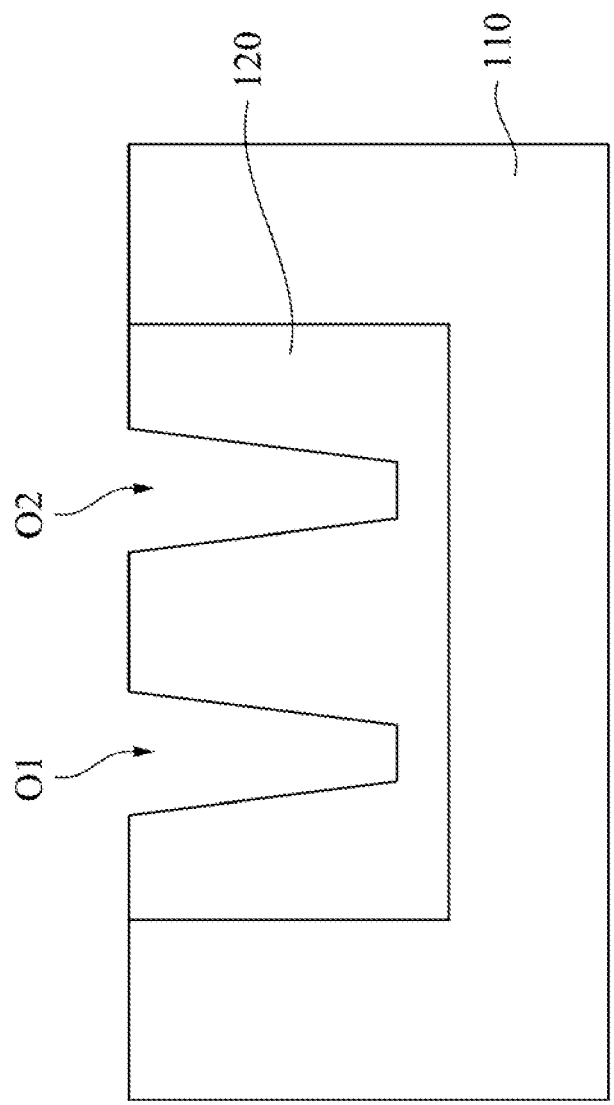

Referring to FIG. 4, after the isolation structure 120 is formed, an etching process is performed to form a first opening O1 and a second opening O2 in the isolation structure 120 such that the isolation structure 120 is partially removed. The opening O1 and the second opening O2 expose underlying isolation structure 120.

Figure 5:
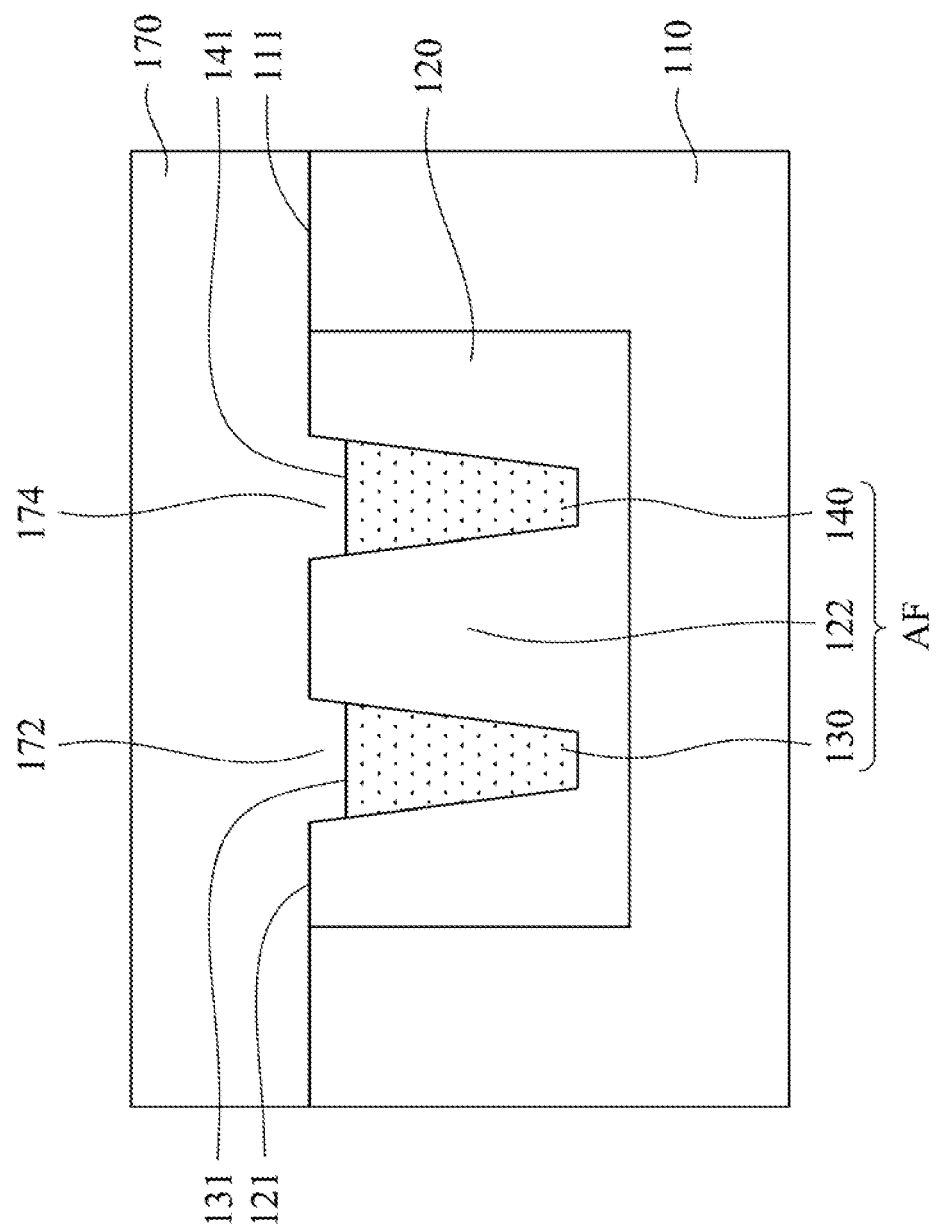

Referring to FIG. 4 and FIG. 5, the first electrode 130 and the second electrode 140 of the anti-fuse structure AF are respectively formed in the first opening O1 and the second opening O2 such that both of the top surface 131 of the first electrode 130 of the anti-fuse structure AF and the top surface 141 of the second electrode 140 of the anti-fuse structure AF are below the top surface 121 of the isolation structure 120. Further, both of the top surface 131 of the first electrode 130 of the anti-fuse structure AF and the top surface 141 of the second electrode 140 of the anti-fuse structure AF are below the top surface 111 of the semiconductor substrate 110.

In some embodiments, forming the first electrode 130 and the second electrode 140 of the anti-fuse structure AF includes filling conductive materials in the first opening O1 and the second opening O2 to respectively form a first electrode layer and a second electrode layer in the isolation structure 120, and then etching back the first electrode layer and the second electrode layer to respectively form the first electrode 130 and the second electrode 140.

In some embodiments, each of the first electrode 130 and the second electrode 140 is a single layer and includes, for example, titanium (Ti) or titanium nitride (TiN). In some embodiments, both of the first electrode 130 and the second electrode 140 are a multi-layered structure and include, for example, a titanium nitride layer and a tungsten layer above the titanium nitride layer. Formation of the first electrode 130 and the second electrode 140 may be exemplarily performed using a CVD process, a PVD process, an ALD process, the like, and/or a combination thereof.

In some embodiments, the first electrode 130 and the second electrode 140 of the anti-fuse structure AF are formed such that the portion 122 of the isolation structure 120 is directly between the first electrode 130 and the second electrode 140, and the portion 122 of the isolation structure is referred as the anti-fuse dielectric material of the anti-fuse structure AF. In some embodiments, the first electrode 130 and the second electrode 140 of the anti-fuse structure AF are surrounded by and in contact with the isolation structure 120.

After the first electrode 130 and the second electrode 140 of the anti-fuse structure AF is formed, a dielectric layer 170 is formed above the isolation structure 120 and the semiconductor substrate 110. The dielectric layer 170 may include a first portion 172 and a second portion 174 within the isolation structure, wherein the first portion 172 is in contact with the first electrode 130 and the second portion 174 is in contact with the second electrode 140. The dielectric layer 170 has a bottommost surface below the top surface 121 of the isolation structure 120 (or the top surface 111 of the semiconductor substrate 110). The dielectric layer 170 may be formed by CVD, high-density plasma CVD, spin-on, sputtering, or other suitable methods. In some embodiments, the dielectric layer 170 is formed of dielectric material different from the isolation structure. For example, the dielectric layer 170 includes nitride (e.g., silicon nitride), while the isolation structure 120 includes oxide (e.g., silicon dioxide).

Figure 6:
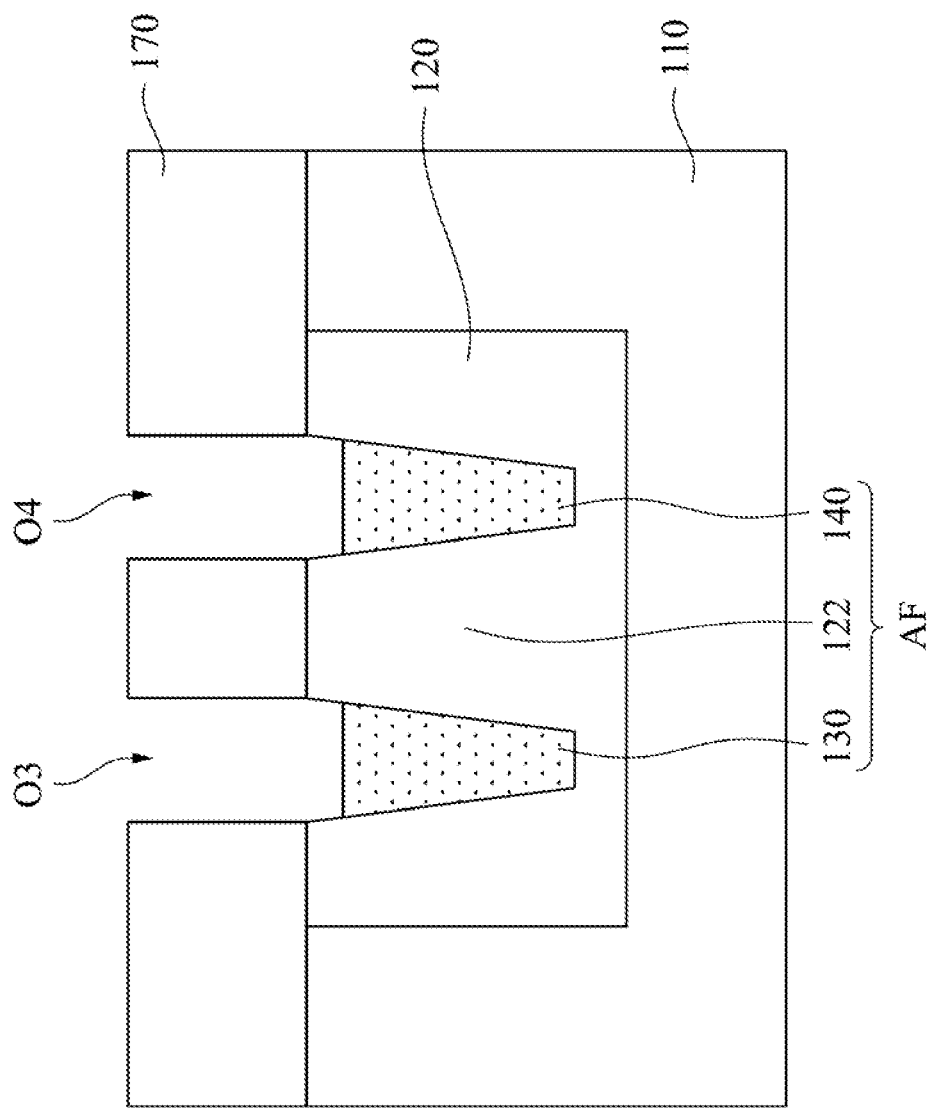

Referring to FIGS. 5 and 6, after the dielectric layer 170 is formed, an, an etching process is performed to form a third opening O3 and a fourth opening O4 in the dielectric layer such that the dielectric layer 170 is partially removed. The etching process removes the first portion 172 and the second portion 174 of the dielectric layer 170 such that the first electrode 130 and the second electrode 140 of the anti-fuse structure AF are exposed.

Referring back to FIG. 2, after the third opening O3 and the fourth opening O4 (see FIG. 6) are formed, the first contact 150 and the second contact 160 are respectively formed in the third opening O3 and the fourth opening O4 (see FIG. 6). The first voltage V1 is applied to the first electrode 130 of the anti-fuse structure AF through the first contact 150 and the second voltage different from the first voltage is applied to the second electrode 140 of the anti-fuse structure through the second contact 160 to convert the portion 122 of the isolation structure 120 between the first electrode 130 and the second electrode 140 of the anti-fuse structure AF into a permanent electrically conductive path. As a result, the memory device 10 as shown in FIG. 2 can be obtained.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A memory device, comprising:
   a semiconductor substrate;
   an isolation structure in the semiconductor substrate; and
   an anti-fuse structure in the isolation structure, the anti-fuse structure comprising:
   a first electrode; and
   a second electrode adjacent to the first electrode, wherein both of a top surface of the first electrode and a top surface of the second electrode are below a top surface of the semiconductor substrate, wherein both of the top surface of the first electrode and the top surface of the second electrode are below a top surface of the isolation structure.

2. The memory device of claim 1, further comprising:
   a first contact on the first electrode; and
   a second contact on the second electrode.

3. The memory device of claim 2, wherein both of a bottom surface of the first contact and a bottom surface of the second contact are below the top surface of the semiconductor substrate.

4. The memory device of claim 2, further comprising:
   a dielectric layer above the semiconductor substrate and the isolation structure.

5. The memory device of claim 4, wherein the first contact includes a bottom portion in the isolation structure and a top portion in the dielectric layer.

6. The memory device of claim 2, wherein the first contact is configured to apply a first voltage to the first electrode and the second contact is configured to apply a second voltage different from the first voltage to the second electrode to convert a portion of the isolation structure between the first electrode and the second electrode into a permanent electrically conductive path.

7. The memory device of claim 1, wherein the top surface of the first electrode is substantially coplanar with the top surface of the second electrode.

8. The memory device of claim 1, wherein a bottom surface of the first electrode is substantially coplanar with a bottom surface of the second electrode.

9. The memory device of claim 1, wherein the first electrode extends along a first direction, and the first electrode and the second electrode are arranged parallel with each other along a second direction perpendicular to the first direction in a top view.

10. The memory device of claim 1, wherein the first electrode has a strip profile in a top view.

11. The memory device of claim 1, wherein the first electrode and the second electrode comprise the same materials.

12. A method of forming memory device, comprising:
  forming an isolation structure in a semiconductor substrate;
  etching the isolation structure to form a first opening and a second opening;
  forming a first electrode and a second electrode of an anti-fuse structure respectively in the first opening and the second opening such that both of a top surface of the first electrode and a top surface of the second electrode are below a top surface of the isolation structure;
  forming a dielectric layer above the isolation structure; and
  applying a first voltage to the first electrode and a second voltage different from the first voltage to the second electrode to convert a portion of the isolation structure between the first electrode and the second electrode into a permanent electrically conductive path.

13. The method of claim 12, further comprising:
  forming a first contact and a second contact in the dielectric layer such that the first voltage is applied to the first electrode through the first contact and the second voltage is applied to the second electrode through the second contact.

14. The method of claim 13, wherein forming the first contact and the second contact is performed such that a portion of the first contact and a portion of the second contact are formed within the isolation structure.

15. The method of claim 13, wherein forming the first contact and the second contact is performed such that the top surface of the first electrode and the top surface of the second electrode are respectively in contact with the first contact and the second contact.

16. The method of claim 12, wherein forming the first electrode and the second electrode is performed further such that the top surface of the first electrode and the top surface the second electrode are below a top surface of the semiconductor substrate.

17. The method of claim 12, wherein forming the first electrode and the second electrode is performed such that the first electrode and the second electrode are in contact with the isolation structure.

18. The method of claim 12, wherein forming the first electrode and the second electrode is performed such that a bottom surface of the first electrode is coplanar with a bottom surface of the second electrode.

19. The method of claim 12, wherein forming the isolation structure in the semiconductor substrate comprises:
  forming a trench in the semiconductor substrate; and
  filling an anti-fuse dielectric material in the trench to form the isolation structure.

* * * * *